United States Patent
Sato et al.

(10) Patent No.: US 7,068,479 B2
(45) Date of Patent: Jun. 27, 2006

(54) MAGNETORESISTANCE EFFECT ELEMENT COMPRISING NANO-CONTACT PORTION NOT MORE THAN A FERMI LENGTH, AND MAGNETIC HEAD UTILIZING SAME

(75) Inventors: Isamu Sato, Tokyo (JP); Rachid Sbiaa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/882,338

(22) Filed: Jul. 2, 2004

(65) Prior Publication Data

US 2005/0068698 A1 Mar. 31, 2005

(30) Foreign Application Priority Data

Sep. 30, 2003 (JP) .......................... P2003-342454

(51) Int. Cl.
*G11B 5/39* (2006.01)
(52) U.S. Cl. .............................. 360/324.12; 360/324.1; 360/324.2
(58) Field of Classification Search ............. 360/324.1, 360/324.11, 324.12, 324.2
See application file for complete search history.

(56) References Cited

U.S. PATENT DOCUMENTS 5,715,121 A * 2/1998 Sakakima et al. ....... 360/324.2
5,936,402 A * 8/1999 Schep et al. ................ 324/252
6,046,891 A * 4/2000 Yoda et al. ............... 360/324.1
6,052,262 A * 4/2000 Kamiguchi et al. .... 360/324.12

(Continued)

FOREIGN PATENT DOCUMENTS

JP 11-510911 9/1999
JP 2003-204095 7/2003

OTHER PUBLICATIONS

N. Garcia, et al., Magnetoresistance In Excess Of 200% In Ballistic Ni Nanocontacts At Room Temperature And 100 Oe, Physical Review Letters, Apr. 5, 1999, 2923-2926, vol. 82, No. 14, © 1999 The American Physical Society.

(Continued)

*Primary Examiner*—Jefferson Evans
(74) *Attorney, Agent, or Firm*—Kenyon & Kenyon LLP

(57) ABSTRACT

A magnetoresistance effect element is composed of a substrate, and a layer lamination structure disposed on the substrate and comprising a buffer layer, an anti-ferromagnetic layer, a pinned layer, an insulating layer including at least one nano-contact portion having a dimension of not more than Fermi length, a free layer composed of a ferromagnetic layer and a domain stability layer, which are laminated in the described order on the substrate. The pinned layer is composed of a first ferromagnetic layer, a non-magnetic layer and a second ferromagnetic layer disposed in this order on the side of the anti-ferromagnetic layer, and the domain stability control including a non-magnetic layer, a ferromagnetic layer and an anti-ferromagnetic layer disposed in this order from the side of the free layer.

10 Claims, 2 Drawing Sheets

U.S. PATENT DOCUMENTS

| | | |
|---|---|---|
| 6,077,618 A * | 6/2000 | Sakakima et al. ........... 428/693 |
| 6,452,764 B1 * | 9/2002 | Abraham et al. ......... 360/324.2 |
| 6,590,750 B1 * | 7/2003 | Abraham et al. ......... 360/324.2 |
| 6,731,475 B1 * | 5/2004 | Ikeda ......................... 360/322 |
| 6,804,090 B1 * | 10/2004 | Kokado ................... 360/324.2 |
| 6,933,042 B1 * | 8/2005 | Gill ............................ 428/213 |
| 2003/0104249 A1 | 6/2003 | Okuno et al. ............... 428/693 |

OTHER PUBLICATIONS

N. Garcia, et al., Ballistic Magnetoresistance In Nanocontacts Electrochemically Grown Between Macro- and Microscopic Ferromagnetic Electrodes, Applied Physics Letters, Mar. 11, 2002, 1785-1787, vol. 80, No. 10, © American Institute of Physics.

* cited by examiner

MAGNETORESISTANCE EFFECT ELEMENT COMPRISING NANO-CONTACT PORTION NOT MORE THAN A FERMI LENGTH, AND MAGNETIC HEAD UTILIZING SAME

BACKGROUND OF THE INVENTION

1. Field of the Invention

The present invention relates to a magnetoresistance (or magneto-resistance) effect element particularly provided with Ballistic Magneto Resistance (BMR) effect and also relates to a magnetic head provided with such magnetoresistance effect element.

2. Relevant Art

Generally, a giant magnetoresistance effect (GMR effect) is a phenomenon indicating rate of change in magnetoresistance (called herein MR ratio) which is developed or reviled in a case that electric current passes in a plane of a lamination structure of ferromagnetic layer/non-magnetic layer/ferromagnetic layer. Moreover, the magnetoresistance effect element of such GMR has been further actively studied for the development of more large MR ratio, and up to now, ferromagnetic tunnel junction and a CPP (Current Perpendicular to Plane)-type MR element, in which the current passes perpendicularly with respect to the lamination structure, have been developed, and hence, has high degree of expectation for reproducing (regenerative) element for magnetic sensor, magnetic recording element and the like.

In the field of the magnetic recording technology, according to improvement of recording density, it has been a progress to make compact recording bits, and as its result, it becomes difficult to obtain a sufficient signal strength. Thus, taking such matters into consideration, it has been desired for engineers in this field to search a material having high sensitive magnetoresistance effect and develop or revile an element indicating a large MR ratio.

Recently, there have been reported, as material indicating MR ratio of more than 100%, "magnetic micro contact" which is formed by butting two needle-like nickel (Ni) as shown, for example, in a document of "Physical Review Letters, vol. 82, p 2923 (1999), by N. Garcia, M. Munoz, and Y.-W. Zhao" (Document 1). This magnetic micro contact is manufactured by butting two ferromagnetic materials arranged in form of needle or in form of triangle. More recently, there has been developed a magnetic micro contact in which two fine Ni wires are arranged in T-shape and micro column is grown at a contact portion of these wires by electro-deposition method (for example, refer to a document of "Appl. Phys. Lett. Vol. 80, p 1785 (2002), by N. Garcia, G. G. Qian, and I. G. Sveliev" (Document 2).

It is considered that an extremely high MR ratio developing such element is based on spin transport of a magnetic area existing in the magnetic nano contact formed between two ferromagnetic layers having magnetized directions in anti-parallel to each other. It is considered that, in the magnetoresistance effect element utilizing the magnetic nano contact having such characteristics, since electrons pass without receiving any scattering or diffusion (i.e., pass ballistically), such magnetoresistance effect element is called BMR element (Ballistic Magneto Resistance element).

In addition, more recently, there has also been reported a magnetoresistance effect element having such magnetic nano contact. For example, in Japanese Patent Laid-open (KOKAI) Publication No. 2003-204095 (Document 3), there is reported a magnetoresistance effect element composed of first ferromagnetic layer/insulating layer/second ferromagnetic layer, in which the first ferromagnetic layer is connected to the second ferromagnetic layer at a predetermined portion of the insulating layer, the magnetoresistance effect element being provided with a hole having the maximum diameter of less than 20 nm. Furthermore, in Japanese Patent Application National Publication (Laid-open) No. HEI 11-510911 (Document 4), there is reported a magnetoresistance effect element composed of two magnetic layers connected to each other through a narrow segment having a width of about 100 nm.

However, in consideration of application of a BMR element to a magnetic head, a dimension of a free layer sensitive to magnetic field leaking from a surface of a medium is made small such as, for example, to several tens nm. In a case of recording density of 1 Tbits/in2, a read head of 40 to 50 nm width is required, and in a case of a BMR element capable of realizing an extremely high MR ratio, a structure of a magnetic domain of the magnetic nano contact (called hereinlater "nano-contact portion") is a "key" of the DMR effect As the read head miniaturization progresses, strong demagnetizing magnetic field is generated from the end face of the fine free layer, which results in a degradation of its thermal instability, being inconvenient and disadvantageous. Therefore, in the BMR element, it is an extremely important object to ensure the magnetic domain control and magnetic stability thereof.

SUMMARY OF THE INVENTION

An object of the present invention is to substantially eliminate defects or drawbacks encountered in the prior art mentioned above and to provide a magnetoresistance effect element, particularly for a magnetic head, having BMR effect capable of achieving improved stability and sensitivity of a free layer and a magnetic domain of a nano-contact portion constituting the magnetoresistance effect element.

Another object of the present invention is to also provide a magnetic head provided with such magnetoresistance effect element.

These and other objects can be achieved according to the present invention, by providing, in one aspect, a magnetoresistance effect element comprising:

a substrate; and a layer lamination structure disposed on the substrate and comprising a buffer layer, an anti-ferromagnetic layer, a pinned layer, an insulating layer including at least one nano-contact portion having a dimension of not more than Fermi length, a free layer composed of a ferromagnetic layer and a domain stability layer, which are laminated in the described order on the substrate, the pinned layer being composed of a first ferromagnetic layer, a non-magnetic layer and a second ferromagnetic layer disposed in this order on the side of the anti-ferromagnetic layer, and the domain stability layer including a non-magnetic layer, a ferromagnetic layer and an anti-ferromagnetic layer disposed in this order from the side of the free layer.

In this aspect, the free layer has the same direction of magnetization as that of the ferromagnetic layer constituting the domain stability layer.

According to the magnetoresistance effect element of this aspect, the insulating layer including at least one nano-contact portion having a dimension of not more than Fermi length is disposed between the free layer and the pinned layer, both provided with the ferromagnetic layer, so that the bottom-type magnetoresistance effect element thus obtained can perform the signal detection at high sensitivity due to the BMR effect caused by the location of the nano-contact portion. Moreover, since the domain stability layer disposed on the free layer is composed of the non-magnetic layer, one or two ferromagnetic layers and the anti-ferromagnetic layer laminated in this order from the free layer side. By this way, the free layer can be made monodomain, thus achieving and ensuring high magnetic stability and output read signal.

In another aspect of the present invention, there is also provided a magnetoresistance effect element comprising:

a substrate;

a layer lamination structure disposed on the substrate and comprising a buffer layer, a free layer composed of a ferromagnetic layer, an insulating layer including at least one nano-contact portion having a dimension of not more than Fermi length, a pinned layer and an anti-ferromagnetic layer, which are laminated in the described order on the substrate;

insulating layer at the side of the layer lamination structure; and domain stability layers disposed on both side portions of the layer lamination structure through the side insulating layer, respectively, the pinned layer being composed of a first ferromagnetic layer, a non-magnetic layer and a second ferromagnetic layer disposed in this order on the side of the insulating layer, and the domain stability layer being composed of a ferromagnetic layer and an anti-ferromagnetic layer.

In this aspect, the free layer has the same direction of magnetization as that of the ferromagnetic layer constituting the domain stability layer.

According to the magnetoresistance effect element of this aspect, the insulating layer including at least one nano-contact portion having a dimension of not more than Fermi length is also disposed, as in the former aspect, between the free layer and the pinned layer both provided with the ferromagnetic layer, so that the top-type magnetoresistance effect element thus obtained can perform the signal detection at high sensitivity due to the BMR effect caused by the location of the nano-contact portion. Moreover, the domain stability layers, each composed of the ferromagnetic layer and anti-ferromagnetic layer, are disposed on both side portions of the layer lamination structure achieving the BMR effect through the insulating layer, respectively, so that the high magnetic stability can be achieved and ensured.

Furthermore, in both the above aspects, the ferromagnetic layer forming the free layer has a direction of magnetization normal to that of the first and second ferromagnetic layers forming the pinned layer.

The first and second ferromagnetic layers forming the pinned layer have directions of magnetization which are anti-parallel to each other. The two ferromagnetic layers disposed on both sides of the insulating layer are each formed of a ferromagnetic material having spin polarization of not less than 0.5.

The dimension of the nano-contact portion includes at least one of a length in the layer lamination direction and a length of lateral width, extending in a direction normal to the lamination direction, the dimension being not more than Fermi length, preferably of not more than 100 nm.

In a further aspect of the present invention, there is also provided a magnetic head comprising:

a magnetoresistance effect element;

electrodes disposed on both sides of the magnetoresistance effect element; and a pair of shield members disposed on outside surfaces of the electrodes, respectively, the magnetoresistance effect element comprising: a substrate; and a layer lamination structure disposed on the substrate and comprising a buffer layer, an anti-ferromagnetic layer, a pinned layer, an insulating layer including at least one nano-contact portion having a dimension of not more than Fermi length, a free layer composed of a ferromagnetic layer and a domain stability layer, which are laminated in the described order on the substrate, wherein the pinned layer is composed of a first ferromagnetic layer, a non-magnetic layer and a second ferromagnetic layer disposed in this order on the side of the anti-ferromagnetic layer, and the domain stability layer is composed of a non-magnetic layer, a ferromagnetic layer and an anti-ferromagnetic layer disposed in this order from the side of the free layer.

In the still further aspect, there is also provided a magnetic head comprising:

a magnetoresistance effect element;

electrodes disposed on both sides of the magnetoresistance effect element; and a pair of shield members disposed on outside surfaces of the electrodes, respectively, the magnetoresistance effect element comprising: a substrate; a layer lamination structure disposed on the substrate and comprising a buffer layer, a free layer composed of a ferromagnetic layer, an insulating layer including at least one nano-contact portion having a dimension of not more than Fermi length, a pinned layer and an anti-ferromagnetic layer, which are laminated in the described order on the substrate; insulating layer disposed on both side portions of the layer lamination structure; and domain stability layers disposed on both side portions of the layer lamination structure through the side insulating layer, respectively, wherein the pinned layer is composed of a first ferromagnetic layer, a non-magnetic layer and a second ferromagnetic layer disposed in this order on the side of the insulating layer, and the domain stability layer is composed of a ferromagnetic layer and an anti-ferromagnetic layer.

In this aspect, since the bottom-type or top-type magnetoresistance effect element having high stability and sensitivity can be applied to the magnetic head, the stability of the magnetic head can be also achieved.

The nature and further characteristic features of the present invention will be made more clear from the following descriptions made with reference to the accompanying drawings.

DESCRIPTION OF THE PREFERRED EMBODIMENTS

Preferred embodiments of a magnetoresistance effect element and a magnetic head utilizing the same according to the present invention will be described hereunder with reference to the accompanying drawings.

Further, hereunder, a magnetoresistance effect element of bottom-type structure (called bottom-type magnetoresistance effect element) will be first mentioned, and a magnetoresistance effect element of top-type structure (called top-type magneto-resistance effect element) will be then mentioned, in which the "bottom-type structure" usually means a structure in which a pinned layer is formed at a lower portion of the magnetoresistance effect element in the layer lamination direction, and on the other hand, the "top-type structure" usually means a structure in which a pinned layer is formed at an upper portion of the magneto-resistance effect element.

(1) Bottom-type Magnetoresistance Effect Element

Figure 1:
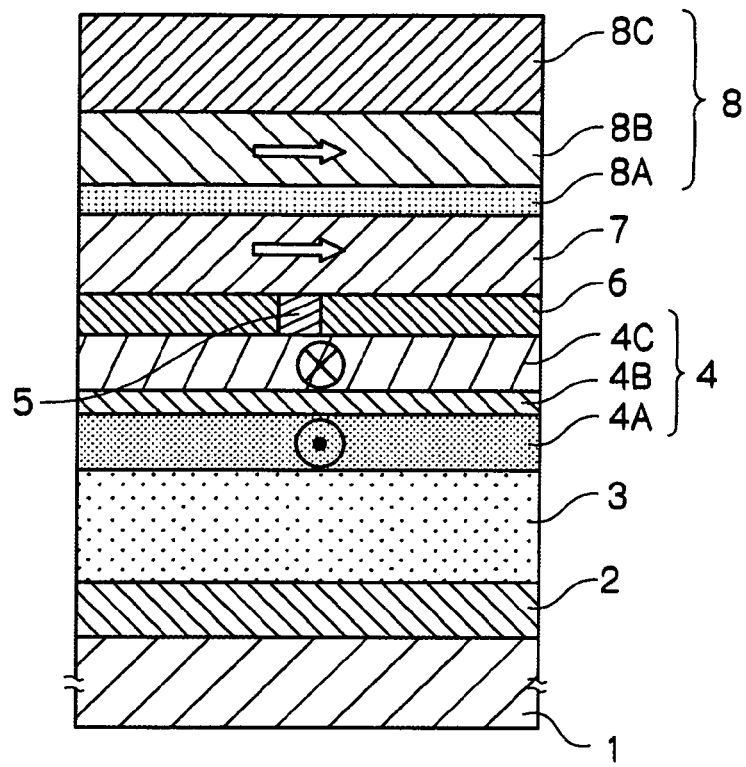
FIG. 1 is a sectional view of a magnetoresistance effect element of bottom-type structure, taken in a layer lamination direction thereof, according to one embodiment of the present invention.

The bottom-type magnetoresistance effect element 10 of the present invention has a layer lamination structure such as shown in FIG. 1. The lamination structure thereof is composed of a buffer layer 2, an anti-ferromagnetic layer 3, a pinned layer 4, an insulating layer 6 provided with at least one (one or more than one) nano-contact portion 5, having a dimension of less than Fermi length, a ferromagnetic free layer 7 and a domain stability layer 8, which are laminated on a substrate (board) 1 in the described order such as shown in FIG. 1.

In the above lamination structure, the pinned layer 4 is composed of a first ferromagnetic layer 4A, a non-magnetic layer 4B and a second ferromagnetic layer 4C, which are laminated in this order from the side of the anti-ferromagnetic layer 3. Further, the domain stability layer 8 is composed of a non-magnetic layer 8A, one or two ferromagnetic layers 8B (8B', 8B") and an-anti-ferromagnetic layer 8C, which are laminated in this order from the side of the free layer 7.

The lamination structure constituting layers will be described hereunder more in detail, respectively.

[Substrate]

As the substrate (board) 1, there may be utilized a Si substrate, a Si oxide substrate, an AlTiC substrate or like.

[Buffer Layer]

The buffer layer 2 is disposed to enhance a crystalline performance of the ferromagnetic layer disposed on the buffer layer 2, and it is usually formed as Ta layer, NiCr layer, Cu layer or like through a plasma or ion beam sputtering so as to provide a thickness of 1 to 10 nm, in usual.

[Nano-Contact Portion]

The nano-contact portion 5 in the bottom-type magnetoresistance effect element 10 is disposed in the insulating layer 6 so as to be surrounded thereby therein. Such nano-contact portion 5 is formed from a ferromagnetic material having spin polarization of not less than 0.5, and as such ferromagnetic material, although various kinds of materials are utilized, the following ones will, for example, be listed up.

Ferromagnetic Metal Group: Co; Fe; Ni; CoFe; NiFe; CoFeNi; and so on.

Ferromagnetic Metalloid Group: $CrO_2$; and so.

Ferromagnetic Oxide: $Fe_3O_4$; and so.

In the above ferromagnetic materials, the CoFe, CoFeNi and NiFe may be more preferable.

Figure 2:
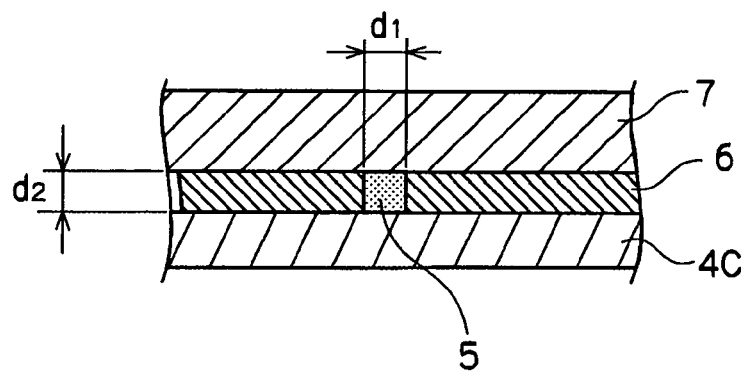
FIG. 2 is an illustration of a nano-contact portion, in an enlarged scale, of the magnetoresistance effect element of FIG. 1.

With reference to FIG. 2, showing one nano-contact portion 5, in an enlarged scale section, constituting a portion of the magnetoresistance effect element of FIG. 1, a length d1 in the width direction thereof, i.e., a direction normal to the layer lamination direction, is set to be less than the Fermi-length.

The nano-contact portion 5 is constituted so as to have a shape of circle, elliptical, rectangular (triangle, square or so) or like supposing that the magnetoresistance effect element be viewed in a plan view such as shown in FIG. 1. In this meaning, the above length d1 of the nano-contact portion 5 will be considered to be equal to the maximum length d1 in the plane in which the nano-contact portion 5 exists as viewed in the plan view of the magnetoresistance effect element 10 such as shown in FIG. 1, and accordingly, in the present invention, it will be said that the maximum length d1 of the nano-contact portion 5 is less than the Fermi length.

The Fermi length being of the length d1 of the nano-contact portion 5 in its width direction is a value specific to material (specific value or characteristic value), which is different for every material constituting the ferromagnetic material forming the nano-contact portion 5. However, many kinds of such ferromagnetic materials have the Fermi length of about 60 nm to 100 nm, so that the words "less than the Fermi length" will be prescribed as "less than 100 nm" or "less than 60 nm". In fact, Ni has the Fermi length of about 60 nm and that of Co is of about 100 nm.

Furthermore, it is more desirable that the length of the nano-contact portion 5 in its width direction is less than a mean free path. Although the value of this mean free path is also a value specific to ferromagnetic materials constituting the nano-contact portions, many of them reside in a range of about 5 nm to 15 nm. Accordingly, in this meaning, the word "less than mean free path" will be prescribed substantially equivalently as "less than 15 nm" or "less than 5 nm". In concrete examples, NiFe has a mean free path of about 5 nm and that of Co is of about 12 nm.

Incidentally, it is also desirable that a length (distance) d2 of the nano-contact portion 5 in the layer lamination direction, i.e., vertical direction as viewed in the plane of FIG. 1 or 2 is also less than the Fermi length as like as the length d1. More specifically, it is desired to be prescribed as being less than 100 nm or less than 60 nm, and moreover, it is further desirable for the length d2 to be prescribed to be less than the mean free path, i.e., less than 15 nm or less than 5 nm as mentioned above.

On the contrary, in a case that the lengths d1 and d2 in the width and lamination directions of the nano-contact portion 5 exceed the Fermi length, the thickness of the magnetic wall of the nano-contact portion 5 becomes large in the case that the magnetization shows an anti-parallel state, and hence, it becomes difficult for electron passing the nano-contact portion 5 to keep spin information. As a result, in this meaning too, it is desirable for the preferred embodiment of the present invention that the dimension of the nano-contact portion 5 (d1 and d2) is less than the Fermi length, and especially, in the viewpoint of well keeping the spin direction, it is less than the mean free path.

Further, on the other hand, in the case where the lengths d1 and d2 in the width and lamination directions of the nano-contact portion 5 are less than the Fermi length, a thin wall section is generated to the magnetic wall section of the nano-contact portion 5. Accordingly, relative relationship in magnetization arrangement between the pinned layer 4 and the free layer 7, between which the nano-contact portion 5 is sandwiched, varies, and hence, electric resistance between the pinned layer 4 and the free layer 7 will also vary. In the case of the magnetoresistance effect element 10 of the present invention, since basically, there exists a magnetic field area, in which the electric resistance is reduced in accordance with the magnetic field even if magnetic field applying direction be changed, it will be said that the magnetoresistance effect produced there is the effect which is produced by the magnetic wall formed to the nano-contact portion 5. Herein, the magnetic wall of the nano-contact portion 5 acts as a transition region or area of two portions (i.e., two ferromagnetic layers 4C and 7 sandwiching the nano-contact portion 5) having different magnetized directions. Further, according to the present invention, the magneto-resistance effect more than 50% will be produced in accordance with the magnetized direction and magnitude of the applied magnetic field.

Such nano-contact portion 5 can be manufactured with high precision by fine working means such as nano-lithography micro-fabrication. Since the magnetoresistance effect element, of the present invention, provided with such nano-contact portion 5 indicates a large MR ratio, it is considered that electrons can ballistically pass through the nano-contact portion 5 without any scattering of impurities. Further, the MR ratio mentioned above means an MR ratio ($\Delta R/R$), which is defined by an electrical resistance R at a time of sufficiently large magnetic strength and an electrical resistance change $\Delta R$ at a time when an applied magnetic field is changed.

A portion (or portions) other than the nano-contact portion 5 disposed between the two ferromagnetic layers 4C and 7 is composed of (or forms) the insulating layer 6, which is formed of, for example, an oxide such as aluminum oxide or silicon oxide or insulating material such as nitride of, for example, silicon nitride. This insulating layer 6 has its length in the lamination direction substantially the same as the length d1 in the width direction of the nano-contact portion 5. Further, as mentioned before, it may be said that one or more than one (at least one) nano-contact portions 5 are formed in the insulating layer 6 with the same thickness as that of the insulating layer 6.

[Ferromagnetic Layers]

In the structure mentioned above, two ferromagnetic layers disposed so as to sandwich the nano-contact portion(s) 5 therebetween is the second ferromagnetic layer 4C of the pinned layer 4 and the ferromagnetic layer forming the free layer 7.

In this embodiment, these ferromagnetic layers are formed of a ferromagnetic material having the spin polarization of not less than 0.5. For this purpose, although various ferromagnetic materials may be utilized, the same or identical material as or to that for the nano-contact portion 13 will be preferably utilized.

In the structure that the nano-contact portion 5 and the ferromagnetic layers adjacent to the sandwiched nano-contact portion 5 are formed of the same ferromagnetic material, the film formation and etching processing can be done with the same one ferromagnetic material and, in addition, granular structural film formation technique can be preferably utilized, thus being advantageous and effective for the manufacturing of the magnetoresistance effect element 10.

[Pinned Layer]

In the bottom-type magnetoresistance effect element 10 of the structure described above, the pinned layer 4 may be called "pin layer (pinned layer)", which is disposed between the anti-ferromagnetic layer 3 and the insulating layer 6 including the nano contact portion 5. This pinned layer 4 is composed of the first ferromagnetic layer 4A, the non-magnetic layer 4B and the second ferromagnetic layer 4C in this order from the side of the anti-ferromagnetic layer 3.

The first and second ferromagnetic layers 4A and 4C constituting the pinned layer 4 may be formed of various kinds of ferromagnetic materials having the spin polarization of not less than 0.5, and CoFe, Co or like will be more preferably utilized. In such case, these two ferromagnetic layers 4A and 4B may be formed of the same material or materials different to each other, and their thicknesses are also made equal to or different from each other, generally, to about 2 to 10 nm through the plasma or ion beam sputtering.

The non-magnetic layer 4B sandwiched between these ferromagnetic layers 4A and 4C is formed of a material selected from the group consisting of Ru, Rh, Ir, Cu, Ag or Au, or alloy thereof so as to have a thickness, in usual, of about 0.5 to 2 nm through the sputter deposition process.

These two ferromagnetic layers 4A and 4C are spaced by the non-magnetic layer 4B so as to have their magnetizations aligned in the opposite directions. According to the function of this non-magnetic layer 4B, the magnetization of these two ferromagnetic layers 4A and 4C can be stabilized. As a result, high pinning field can be obtained and the free layer biasing point can be adjusted.

Further, these ferromagnetic layers 4A and 4C and non-magnetic layer 8 may be preferably formed through plasma or ion beam sputtering.

[Free Layer]

In the bottom-type magnetoresistance effect element 10 of the structure mentioned above, the free layer 7 is a ferromagnetic layer (i.e., third ferromagnetic layer in this embodiment) in which magnetization is rotated in one or reverse direction in response to a magnetic field generated from recorded media bits, and it is desired to have the direction of an easy-axis magnetization parallel to the medium.

This third ferromagnetic layer as the free layer 7 may be preferably formed of various materials having the spin polarization of not less than 0.5, and the material of CoFe or Co will be more preferably utilized to form it generally having its thickness of about 0.5 to 5 nm through the plasma or ion beam sputtering.

[Magnetic Stability Control Layer]

The domain stability layer 8 is a layer provided for controlling the stability of the magnetization direction of the free layer 7, and hence, is disposed on the ferromagnetic layer of the free layer 7 (i.e., third ferromagnetic layer). This domain stability layer 8 is composed of the non-magnetic layer 8A, one or more than one ferromagnetic layers 8B (8B', 8B") and the anti-ferromagnetic layer 8C in this order from the side of the free layer 7.

The non-magnetic layer 8A is a layer for reducing the exchange coupling between the free layer 7 and the ferromagnetic layer 8B as viewed in FIG. 1. The non-magnetic layer 8A is formed of a material selected from the group consisting of Ru, Rh, Ir, Cu, Ag or Au, Ta, Cr, or alloy thereof so as to have a thickness, in usual, of about 0.3 to 3 nm through the plasma or ion beam sputtering.

The domain stability layer 8 has a configuration in which the magnetization direction of the ferromagnetic layer 8B is the same as that of the ferromagnetic free layer 7. The ferromagnetic layer 8B includes two cases of one layer 8B' and two layers 8B' and 8B". In the case of the one layer 8B', it will be formed of CoFe, NiFe or like through the ion beam or plasma sputtering deposition so as to provide a film thickness of 1 to 5 nm, in usual.

Figure 3:
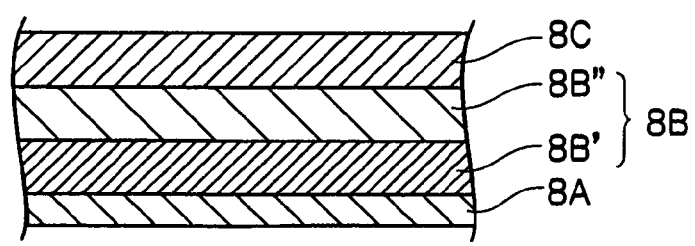
FIG. 3 is a sectional view showing a domain stability layer composed of a ferromagnetic layer and an antiferromagnetic layer.

On the other hand, in the case of two layers 8B' and 8B", formed, in this order from the side of the non-magnetic layer 8A as shown in FIG. 3, the ferromagnetic layer 8B' is a layer acting to make the free layer 7 as single magnetic domain through the magnetostatic coupling and is formed of CoFe, NiFe or like through the ion beam or plasma sputtering deposition so as to provide the film thickness of 1 to 5 nm, in usual. The ferromagnetic layer 8B" is a layer, on the other hand, to generate a high exchange coupling with the anti-ferromagnetic layer 8C, thus the layer 8B will have its magnetization fixed.

The anti-ferromagnetic layer 8C is a layer disposed on the ferromagnetic layer 8B in the lamination state shown in FIG. 1. The anti-ferromagnetic layer 8C is formed of a material selected from the group consisting of PtMn, IrMn, PtPdMn and FeMn through the ion beam or plasma sputtering so as to provide a film thickness, in usual, of about 2 to 20 nm.

(2) Top-type Magnetoresistance Effect Element

Figure 4:
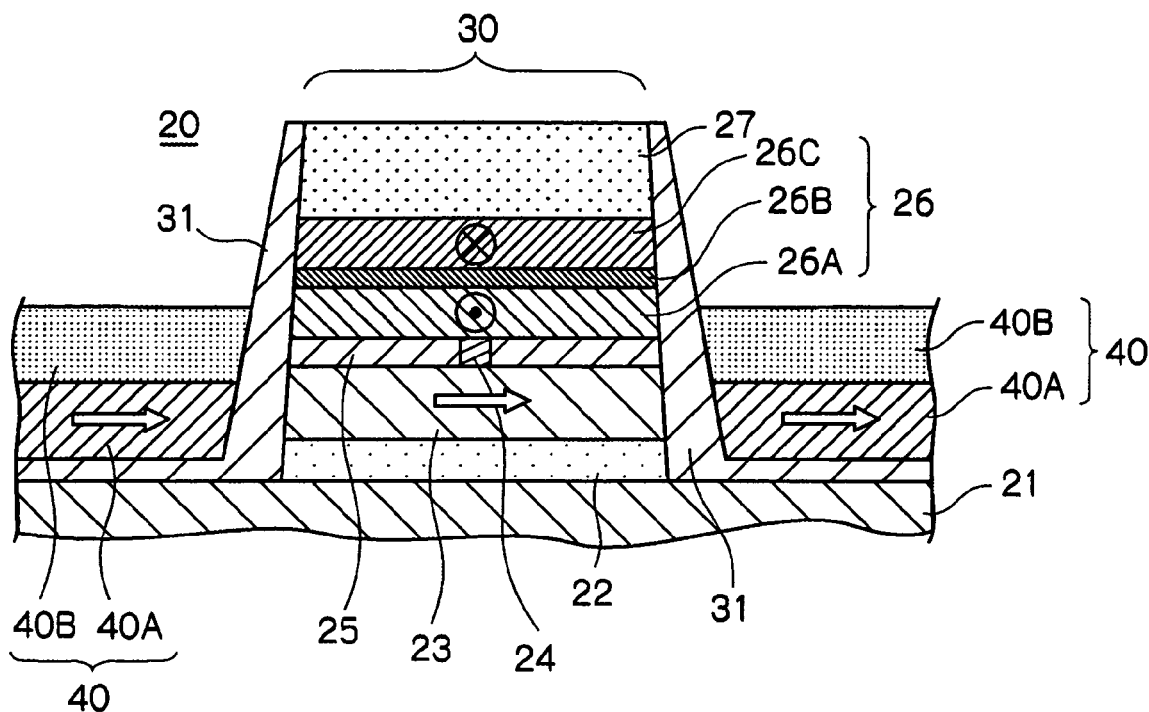
FIG. 4 is a sectional view of a magnetoresistance effect element of top-type structure, taken in a layer lamination direction thereof, according to another embodiment of the present invention.

The other embodiment of the magnetoresistance effect element of the present invention, as the top-type one, will be described hereunder with reference to FIG. 4 illustrating a sectional view of the layer lamination of the magnetoresistance effect element of this embodiment.

The top-type magnetoresistance effect element 20 of this embodiment has an arrangement, different from that of the bottom-type one 10, in which the free layer and the pinned layer are substituted with each other in the vertical position in the layer lamination structure of FIG. 4.

That is, this top-type magnetoresistance effect element 20 includes a layer lamination structure 30 comprising a buffer layer 22, a free layer 23 composed of ferromagnetic layer, an insulating layer 25 provided with one or more than one (at least one) nano-contact portions 24 each having a dimension of Fermi length, a pinned layer 26 and an anti-ferromagnetic layer 27, which are laminated on a substrate 21 in the described order. The bottom shield and eventually bottom electrode are not shown in this figure and are deposited between the substrate 21 and the buffer layer 22. The top-type magnetoresistance effect element 20 is composed of such layer lamination structure 30, side insulating layer 31 formed at both side portions of the layer lamination structure 30 and domain stability layers 40 disposed on both side portions of the layer lamination structure 30 through the side insulating layer 31, respectively.

In such arrangement, the pinned layer 26 is composed of a first ferromagnetic layer 26A, a non-magnetic layer 26B and a second ferromagnetic layer 26C arranged in this order from the side of the insulating layer 25. Each of the domain stability layers 40 is composed of a ferromagnetic layer 40A and an anti-ferromagnetic layer 40B, which are laminated as layer lamination structure.

Further, since the substrate 21, the buffer layer 22, the free layer 23 composed of the ferromagnetic layer, the nano-contact portion(s) 24, the insulating layer 25, the pinned layer 26 and the anti-ferromagnetic layer 27 constituting the layer lamination structure 30 of this top-type magnetoresistance effect element 20 are substantially the same, in their materials and natures, as those of the bottom-type magnetoresistance effect element 10 mentioned hereinbefore, the detail explanations thereof are omitted herein.

Accordingly, the characteristic feature of the top-type magnetoresistance effect element 20 resides in that the side insulating layer 31 are formed on both side surfaces of the layer lamination structure 30 and the magnetic stability control layers 40 are also disposed on both the side portions through the insulating layer 31 as shown in FIG. 4.

The side insulating layer 31 is formed of an oxide such as aluminum oxide or silicon oxide, or nitride such as silicon nitride through the plasma or ion beam sputtering.

Each of the magnetic stability control layers 40, which is a layer for controlling the stability of the magnetization of the free layer 23, is composed of the ferromagnetic layer 40A and the anti-ferromagnetic layer 40B.

Further, it is preferred that the ferromagnetic layer 40A constituting the domain stability layer 40 is formed of the same material as that forming the ferromagnetic layer 8B of the bottom-type magnetoresistance effect element 10 such as CoFe, NiFe or like.

On the other hand, it is preferred that the anti-ferromagnetic layer 40B constituting the domain stability layer 40 is formed of the same material as that forming the anti-ferromagnetic layer 8C of the bottom-type magneto-resistance effect element 10 such as one selected from the group consisting of PtMn, IrMn, PtPdMn and FeMn, or like through the ion beam or plasma sputtering so as to provide a film thickness of 2 to 20 nm, in usual.

In the embodiment of the bottom-type and top-type magnetoresistance effect elements 10 and 20 of the present invention, the two ferromagnetic layers between which the nano-contact portion is disposed have magnetization directions normal to each other. That is, the magnetization direction of the ferromagnetic layer forming the free layer 7 and that of the first and second ferromagnetic layers 4A and 4C forming the pinned layer 4 are normal to each other.

Furthermore, each of the bottom-type and top-type magneto-resistance effect elements 10 and 20 of the present invention has a flat surface in form of layer so as to make easy the magnetic domain control, so that it is possible to easily and properly adjust the distribution condition of magnetization, and it is also possible to sharply keep the magnetic wall width between the ferromagnetic layers opposing to each other with the nano-contact portion being sandwiched therebetween and hence to achieve large MR ratio. However, it is not always necessary for these two ferromagnetic layers to provide a flat layer surface, and it may be possible to provide a slightly rough surface or curved surface.

Furthermore, the present invention may include embodiments in which one or plural nano-contact portions 5 are arranged, and in the case where plural (more than one) nano-contact portions 5 are disposed between the free layer and the pinned layer (i.e., between two ferromagnetic layers thereof), the MR value may be slightly reduced, but, in comparison with the arrangement of the single nano-contact portion 5, the scattering of the MR values in each element could be reduced, thus easily reproducing the stable MR characteristics.

[Magnetic Head]

A magnetic head (magneto-resistive head) formed by utilizing the magnetoresistance effect element of the present invention of the structures and characters mentioned above can provide a large reproduced sensitivity because, by utilizing such magnetoresistance effect element, the MR ratio of more than 50% can be produced.

Figure 5:
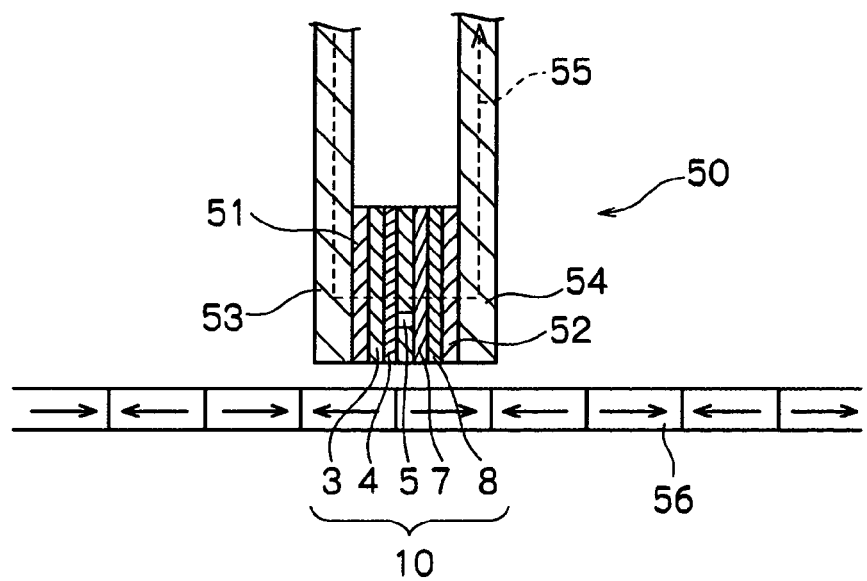
FIG. 5 is an illustration of a magnetic head utilizing the magnetoresistance effect element according to the present invention mentioned above.

FIG. 5 is an illustrated example of an embodiment of the magnetic head utilizing the bottom-type magnetoresistance effect element of the present invention, mentioned hereinabove, as a magnetic reproducing element.

With reference to FIG. 5, the magnetic head 50 of this embodiment comprises: the magnetoresistance effect element 10 of the structure shown in FIG. 1 including the anti-ferromagnetic layer 3, the pinned layer 4, the nano-contact portion 5, the free layer 7 and the domain stability layer 8; electrodes 51 and 52 disposed outside the anti-ferromagnetic layer 3 and the domain stability layer 8; and shield members 53 and 54 both disposed further outside the electrodes 51 and 52. Reference numeral 55 shows a flow path of a sensing current.

In the magnetic head 50, the magnetoresistance effect element 10 is disposed so that the film surface thereof has a vertical arrangement with respect to a recording medium 56. In the illustrated arrangement, the nano-contact portion 5 is arranged in a direction approaching the recording medium 56 from the center of the magnetoresistance effect element 10.

Furthermore, in the illustrated embodiment of FIG. 5, although a horizontal magnetized film is illustrated as the recording medium 56, it may be substituted with a vertical magnetized film.

The magnetoresistance effect element 10 of the embodiment shown in FIG. 5 has a width of 20 to 100 nm, and the respective layers constituting this element 10 having a thickness in the range of 0.5 to 20 nm may be optionally selected in accordance with the recording density and the required sensitivity to be utilized. Furthermore, the one or more nano-contact portions may be formed so as to provide the thickness of 2 to 20 nm.

As mentioned above, according to the magnetoresistance effect element mounted to the magnetic head of the present invention, the easy axis of the free layer arranged in opposition to the recording medium formed of the horizontal magnetic film provides a direction parallel to the magnetization direction of the recording medium, and the magnetization of the easy axis is rotated in sensitive response to the magnetic field generated from the magnetization transition region of the recording medium in case of longitudinal recording or from the bit itself in case of perpendicular magnetic recording. As a result, the leak field of the recording medium can be sensitively read out. Moreover, the magnetoresistance effect element can indicate the magnetoresistance effect more than 50%, thus providing the magnetic head with high sensitivity and with improved stability in function.

Furthermore, according to the present invention, the magnetic head may be also manufactured by utilizing the top-type magnetoresistance effect element 20 shown in FIG. 4 in substantially the same manner as mentioned above with respect to the magnetic head utilizing the bottom-type magnetoresistance effect element 10.

It is to be noted that the present invention is not limited to the described embodiment and many other changes and modifications may be made without departing from the scopes of the appended claims.

What is claimed is:

1. A magnetoresistance effect element comprising:
    a substrate; and
    a layer lamination structure disposed on the substrate and comprising a buffer layer, an anti-ferromagnetic layer, a pinned layer, an insulating layer including at least one nano-contact portion having a dimension of not more than Fermi length, a free layer composed of a ferromagnetic layer and a domain stability layer, which are laminated in the described order on the substrate,
    said pinned layer being composed of a first ferromagnetic layer, a non-magnetic layer and a second ferromagnetic layer disposed in this order on the side of the anti-ferromagnetic layer, and
    said domain stability layer including a non-magnetic layer, a ferromagnetic layer and an anti-ferromagnetic layer disposed in this order from the side of the free layer and said free layer having a same direction of magnetization as that of the ferromagnetic layer constituting the domain stability layer.

2. A magnetoresistance effect element according to claim 1, wherein said ferromagnetic layer forming the free layer has a direction of magnetization normal to that of the first and second ferromagnetic layers forming the pinned layer.

3. A magnetoresistance effect element according to claim 1, wherein said first and second ferromagnetic layers forming the pinned layer have directions of magnetization which are anti-parallel to each other.

4. A magnetoresistance effect element according to claim 1, wherein said dimension of the nano-contact portion includes at least one of a length in the layer lamination direction and a length of lateral width, extending in a direction normal to the lamination direction, said dimension being not more than Fermi length, preferably of not more than 100 nm.

5. A magnetoresistance effect element comprising:
    a substrate;
    a layer lamination structure disposed on the substrate and comprising a buffer layer, a free layer composed of a ferromagnetic layer, an insulating layer including at least one nano-contact portion having a dimension of not more than Fermi length, a pinned layer and an anti-ferromagnetic layer, which are laminated in the described order on the substrate;
    side insulating layer disposed on both side portions of the layer lamination structure; and domain stability layers disposed on both side portions of the layer lamination structure through the side insulating layer, respectively,
    said pinned layer being composed of a first ferromagnetic layer, a non-magnetic layer and a second ferromagnetic layer disposed in this order on the side of the insulating layer, and said domain stability layer being composed of a ferromagnetic layer and an anti-ferromagnetic layer; said free layer having a same direction of magnetization as that of the ferromagnetic layer constituting the domain stability control layer.

6. A magnetoresistance effect element according to claim 5, wherein said ferromagnetic layer forming the free layer has a direction of magnetization normal to that of the first and second ferromagnetic layers forming the pinned layer.

7. A magnetoresistance effect element according to claim 5, wherein said first and second ferromagnetic layers forming the pinned layer have directions of magnetization which are anti-parallel to each other.

8. A magnetoresistance effect element according to claim 5, wherein said dimension of the nano-contact portion includes at least one of a length in the layer lamination direction and a length of lateral width, extending in a direction normal to the lamination direction, said dimension being not more than Fermi length, preferably of not more than 100 nm.

9. A magnetic head comprising:
    a magnetoresistance effect element;
    electrodes disposed on both sides of the magnetoresistance effect element; and
    a pair of shield members disposed on outside surfaces of the electrodes, respectively,
    said magnetoresistance effect element comprising: a substrate; and a layer lamination structure disposed on the substrate and comprising a buffer layer, an anti-ferromagnetic layer, a pinned layer, an insulating layer including at least one nano-contact portion having a dimension of not more than Fermi length, a free layer composed of a ferromagnetic layer and a domain stability layer, which are laminated in the described order on the substrate, wherein said pinned layer is composed of a first ferromagnetic layer, a non-magnetic layer and a second ferromagnetic layer disposed in this order on the side of the anti-ferromagnetic layer, and said magnetic stability control layer is composed of a non-magnetic layer, a ferromagnetic layer and an anti-ferromagnetic layer disposed in this order from the side of the free layer.

10. A magnetic head comprising:

a magnetoresistance effect element;

electrodes disposed on both sides of the magnetoresistance effect element; and a pair of shield members disposed on outside surfaces of the electrodes, respectively, said magnetoresistance effect element comprising: a substrate; a layer lamination structure disposed on the substrate and comprising a buffer layer, a free layer composed of a ferromagnetic layer, an insulating layer including at least one nano-contact portion having a dimension of not more than Fermi length, a pinned layer and an anti-ferromagnetic layer, which are laminated in the described order on the substrate; side insulating layer disposed on both side portions of the layer lamination structure; and domain stability layers disposed on both side portions of the layer lamination structure through the side insulating layer, respectively, wherein said pinned layer is composed of a first ferromagnetic layer, a non-magnetic layer and a second ferromagnetic layer disposed in this order on the side of the insulating layer, and said magnetic stability control layer is composed of a ferromagnetic layer and an anti-ferromagnetic layer.

* * * * *